(12) United States Patent
Yamamoto

(10) Patent No.: US 6,235,171 B1
(45) Date of Patent: May 22, 2001

(54) VACUUM FILM FORMING/PROCESSING APPARATUS AND METHOD

(75) Inventor: Takahiro Yamamoto, Tokyo (JP)

(73) Assignee: TDK Corporation, Tokyo (JP)

(*) Notice: Subject to any disclaimer, the term of this patent is extended or adjusted under 35 U.S.C. 154(b) by 0 days.

(21) Appl. No.: 09/417,021

(22) Filed: Oct. 12, 1999

(30) Foreign Application Priority Data

Oct. 13, 1998 (JP) .................................................. 10-290906

(51) Int. Cl.$^7$ ............................. C23C 14/34; C23C 16/54
(52) U.S. Cl. .................. 204/298.25; 204/298.35; 204/298.23; 204/298.27; 204/298.28; 204/298.29; 204/192.12; 118/719; 118/729; 414/217; 414/222
(58) Field of Search ................. 204/298.25, 298.35, 204/298.23, 298.27, 298.28, 298.29, 192.12; 118/719, 729; 414/217, 222

(56) References Cited

U.S. PATENT DOCUMENTS 5,364,219 * 11/1994 Takahashi et al. .............. 204/298.25

FOREIGN PATENT DOCUMENTS 2-282474   11/1990  (JP).

\* cited by examiner

*Primary Examiner*—Nam Nguyen
*Assistant Examiner*—Daborah Chacko-Davis
(74) *Attorney, Agent, or Firm*—Oliff & Berridge, PLC

(57) ABSTRACT

Disclosed is a vacuum film forming/processing apparatus and method which is hardly influenced by dusts and contamination on a substrate and moreover has a reduced exhaust volume. A substrate chamber for housing and holding a substrate and target chambers for housing and holding a target and an etching chamber are moved relatively. Any one of the target chambers, etching chamber and the substrate chamber are selectively coupled and communicated with each other, thereby creating a film forming chamber. In the film forming chamber, a film forming process to the substrate is performed and a multilayered film is formed. A conveying chamber which is conventionally provided is consequently made unnecessary. A problem of dusts and contamination occurring when the substrate passes through the conveying chamber is eliminated, so that the film quality and its stability are improved.

30 Claims, 11 Drawing Sheets

VACUUM FILM FORMING/PROCESSING APPARATUS AND METHOD

BACKGROUND OF THE INVENTION

1. Field of the Invention

The present invention relates to a vacuum film forming/processing apparatus and method for performing a film process such as forming various thin films onto a substrate or etching films, in vacuum atmosphere.

2. Description of the Related Art

In manufacturing processes of thin film applied devices such as a thin film magnetic head for a magnetic recording apparatus and various semiconductor devices, a film forming apparatus using a dry process such as a sputtering apparatus is often used. A film forming apparatus of such a kind is disclosed in, for example, Japanese Publication of Unexamined Patent Application No. 2-282474. The film forming apparatus disclosed in the publication is constructed as a sputtering film forming apparatus and comprises a conveying chamber having a conveying apparatus in addition to an introducing chamber, a wafer cleaning chamber, and a film forming chamber.

In the example of the film forming apparatus, one etching chamber as a wafer cleaning chamber and one film forming chamber are provided. Generally, a plurality of film forming chambers and a plurality of etching chambers are often provided in accordance with the kinds of thin films to be formed. The film forming chamber is used for performing a thin film forming process onto a substrate as an object on which thin films are formed. The etching chamber is generally used to clean a substrate (wafer) and perform an etching process to the formed thin film. The introducing chamber is used to introduce a substrate and a target from the atmosphere into the apparatus.

In the film forming apparatus, processes of forming and etching a thin film and the like (hereinafter, generically called a film forming process) are performed while sequentially conveying the substrate into a corresponding film forming chamber or etching chamber in accordance with each process. The conveyance of the substrate is carried out by the conveying apparatus in the conveying chamber. The introducing chamber is switched between an atmospheric pressure state and a vacuum state every introduction (replacement) of a new group of substrates and the conveying chamber is always maintained under a vacuum state.

As mentioned above, in a conventional film forming apparatus, a substrate is conveyed to the film forming chamber or the etching chamber always via the conveying chamber. There are consequently problems such that dusts and contamination, which occur in association with movement of the conveying apparatus in the conveying chamber, adhere to the substrate, so that an adverse influence is exerted on the film quality or the uniformity (stability) of the film quality deteriorates.

Although the conveying chamber is maintained under a vacuum state in the film forming apparatus, it is difficult to reduce the volume of the conveying chamber, since it has the conveying apparatus therein. Further, it is also difficult to reduce the volume of the film forming chamber, since it has all of members and mechanisms necessary for film formation, that is, both a part related to the substrate and a part related to the target. Therefore, in case of putting the conveying chamber back under the atmospheric pressure for maintenance or the like of the conveying chamber, or putting the film forming chamber back under the atmospheric pressure for replacement or the like of a target, it takes long time to open the chamber to the atmosphere and exhaust the air. In order to shorten the time, a vacuum pump having a high exhaust capability is necessary and the cost increases.

SUMMARY OF THE INVENTION

The invention has been achieved in consideration of the problems and it is an object of the invention to provide a vacuum film apparatus and method which exerts little influence of dusts on a substrate and moreover can reduce the exhaust volume.

A vacuum film forming/processing apparatus of the invention comprises: a first vacuum chamber for housing and holding a substrate as a target to which a film process is performed; a plurality of second vacuum chambers including at least one vacuum chamber for housing and holding a film formation material; and moving means capable of moving the first and second vacuum chambers relatively; wherein any one of the second vacuum chambers and the first vacuum chamber are selectively coupled to each other so as to communicate the spaces in the chambers with each other, and a film process is performed to the substrate in the first vacuum chamber.

A vacuum film forming/processing method of the invention comprises the steps of: housing and holding a substrate as a target to which a film process is performed in a first vacuum chamber; housing and holding a film formation material in at least one of vacuum chambers included in the plurality of second vacuum chambers; relatively moving the first and second vacuum chambers, thereby selectively coupling any one of the second vacuum chambers to the first vacuum chamber and communicating the spaces in the chambers with each other; and performing a film process to the substrate in the first vacuum chamber.

As used herein, the film process includes both of formation of a thin film and either removal of the formed thin film or process of the thin film into a predetermined shape. Vacuum as used herein denotes not only vacuum in the strict sense but also space or state under pressure lower than atmospheric pressure. In the following description, the definition is similarly applied.

In the vacuum film forming/processing apparatus or method of the invention, a relative moving operation is performed between a first vacuum chamber for housing and holding a substrate and a plurality of second vacuum chambers including at least one vacuum chamber for housing and holding a film formation material; any one of the second vacuum chambers and the first chamber are selectively coupled to each other and the spaces in the chambers are communicated with each other. In such a state, a film process to a substrate in the first vacuum chamber is performed.

According to the vacuum film forming/processing apparatus or method of the invention, it is possible to arrange the plurality of second vacuum chambers in a predetermined direction and move all of the second vacuum chambers together in a predetermined direction.

According to the vacuum film forming processing apparatus or method of the invention, the predetermined direction may be along a straight line extending in the horizontal direction, or along a circle extending in the horizontal direction. In the cases, the first vacuum chamber can be disposed on the horizontal plane including the arranged second vacuum chambers. Further, in this case, the first vacuum chamber can be moved in the horizontal direction toward the second vacuum chamber.

According to the vacuum film forming/processing apparatus or method of the invention, the first vacuum chamber may be disposed either above or below the second vacuum chamber. In this case, the first vacuum chamber can be moved in the vertical direction toward the second vacuum chamber.

According to the vacuum film forming/processing apparatus or method of the invention, the predetermined direction mentioned above may be along a straight line extending in the vertical direction. In this case, the first vacuum chamber can be disposed on the vertical plane including the arranged second vacuum chambers. Further, in this case, the first vacuum chamber can be moved in the horizontal direction toward the second vacuum chamber.

According to the vacuum film forming/processing apparatus or method of the invention, the vacuum chamber for the film formation material may be a sputtering chamber, for housing and holding a sputtering target as the film formation material.

According to the vacuum film forming/processing apparatus or method of the invention, the plurality of second vacuum chambers may include an etching chamber for housing and holding an electrode for etching.

According to the vacuum film forming processing apparatus or method of the invention, the etching electrode can be attained by setting the polarity of the sputtering target so as to be opposite to the polarity in the case of performing a sputtering process.

According to the vacuum film forming/processing apparatus or method of the invention, in a standby state before the communication of the first and second vacuum chambers and before the start of the film process, the first vacuum chamber is controlled so as to maintain the degree of vacuum adapted to the film process, and the second vacuum chamber is controlled so as to maintain a higher degree of vacuum than that of the first vacuum chamber.

Other and further objects, features and advantages of the invention will appear more fully from the following description.

DETAILED DESCRIPTION OF THE PREFERRED EMBODIMENTS

Embodiments of the invention will be described in detail hereinafter making reference to the drawings.

Figure 1:
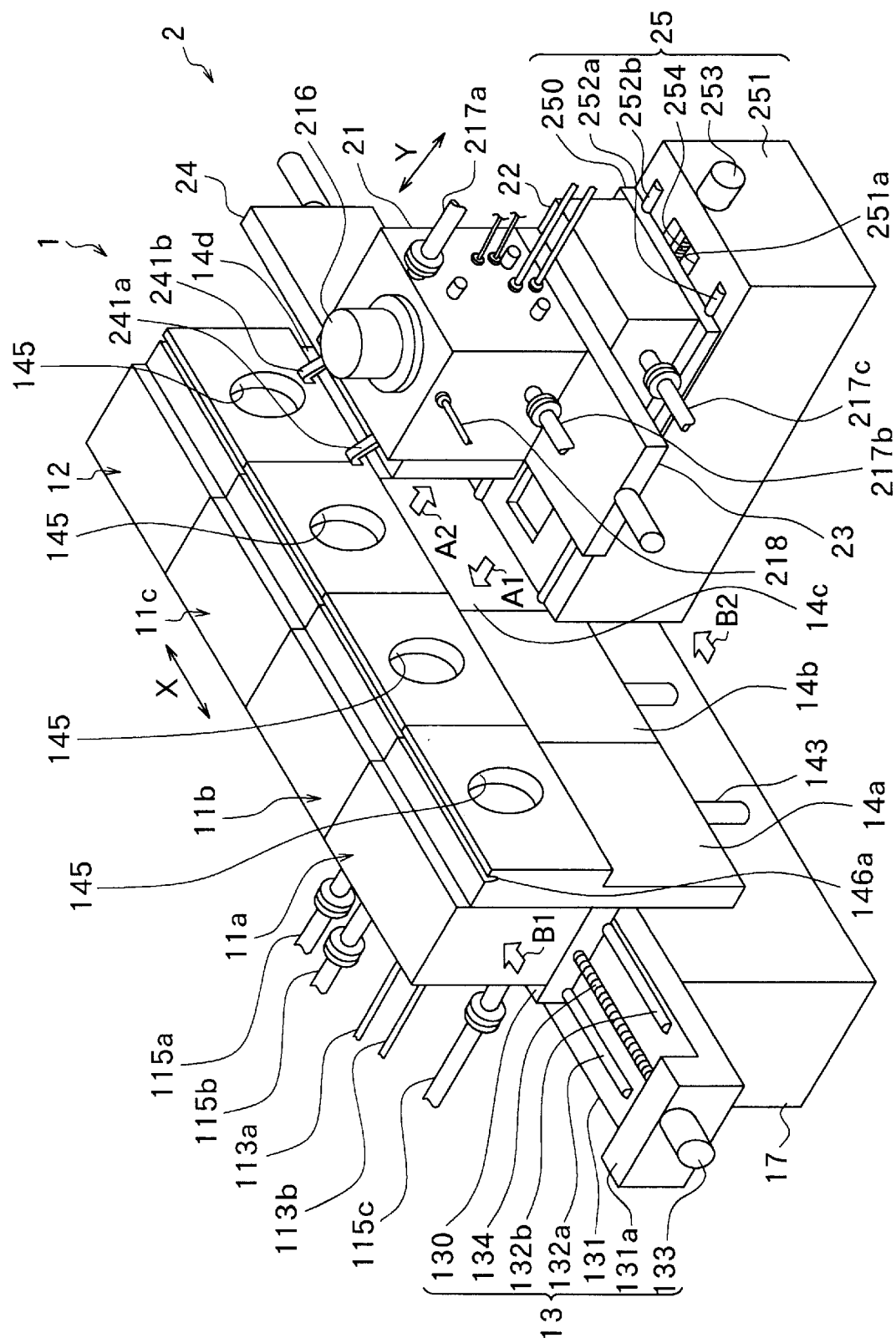
FIG. 1 is a perspective view showing the outside construction of an entire vacuum film forming/processing apparatus according to an embodiment of the invention.
Figure 2:
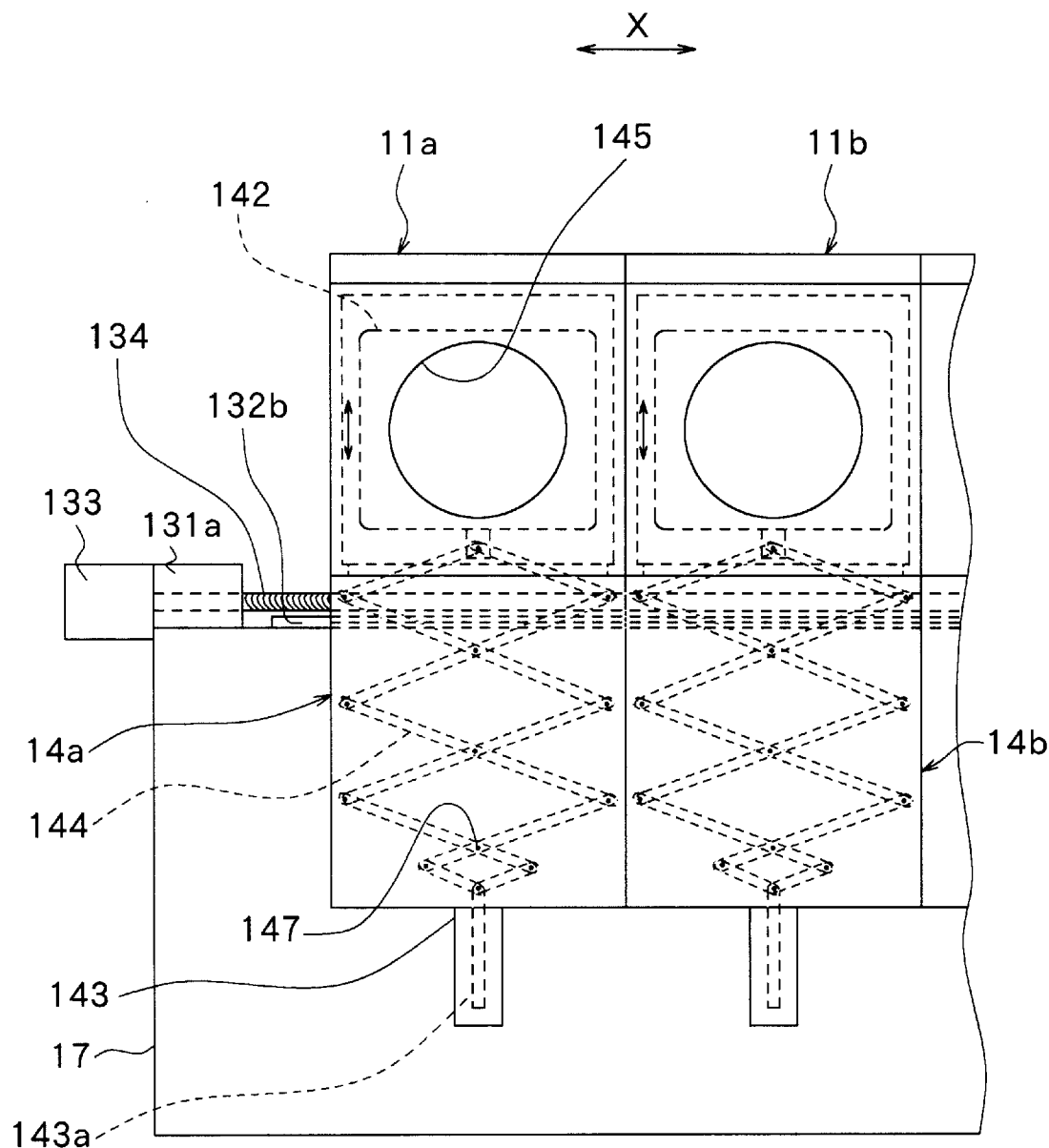
FIG. 2 is a front view showing the structure of a target side mechanism part in FIG. 1.
Figure 3:
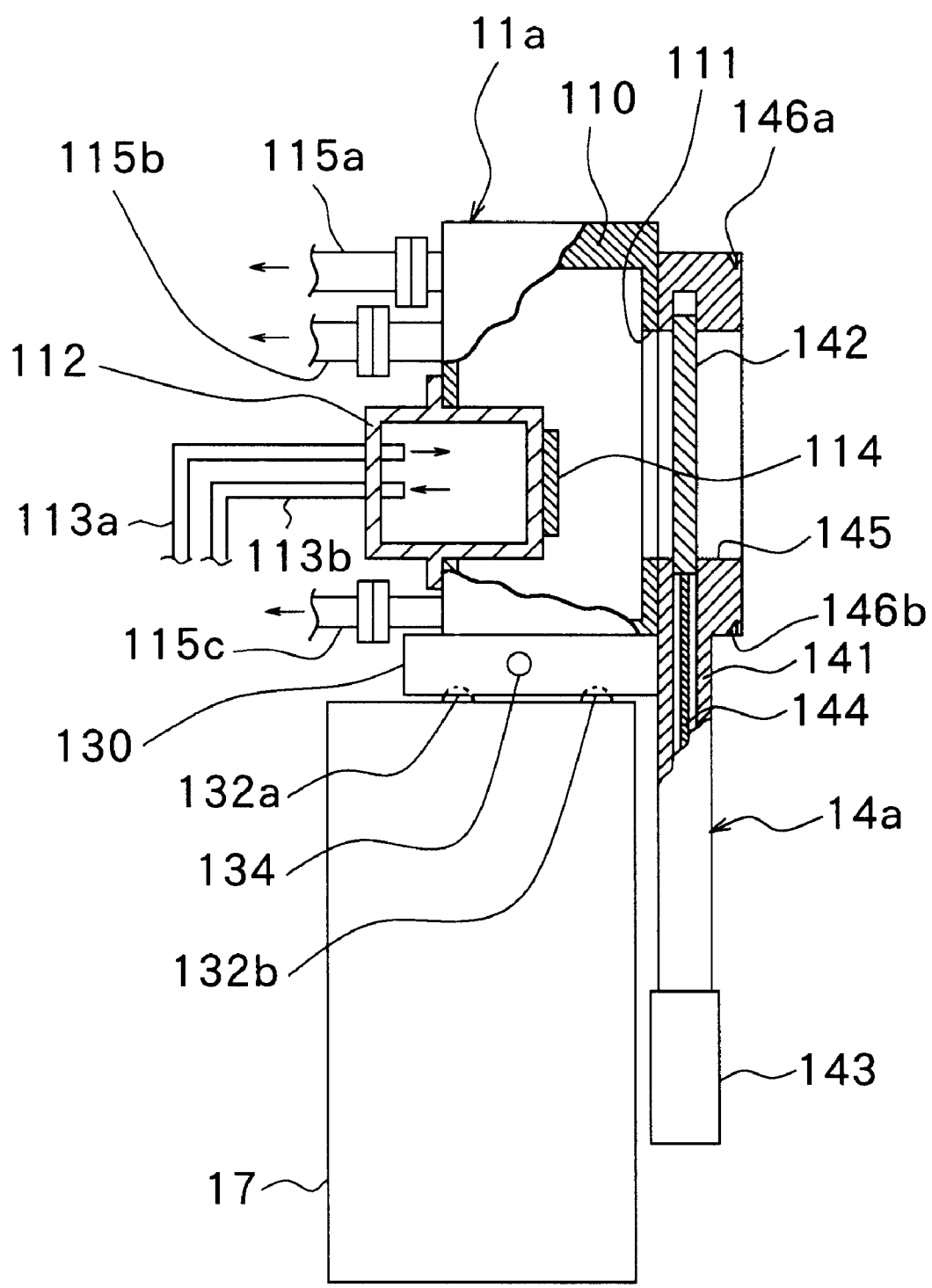
FIG. 3 is a partial cutaway side view showing the structure of a target side mechanism part in FIG. 1.
Figure 4:
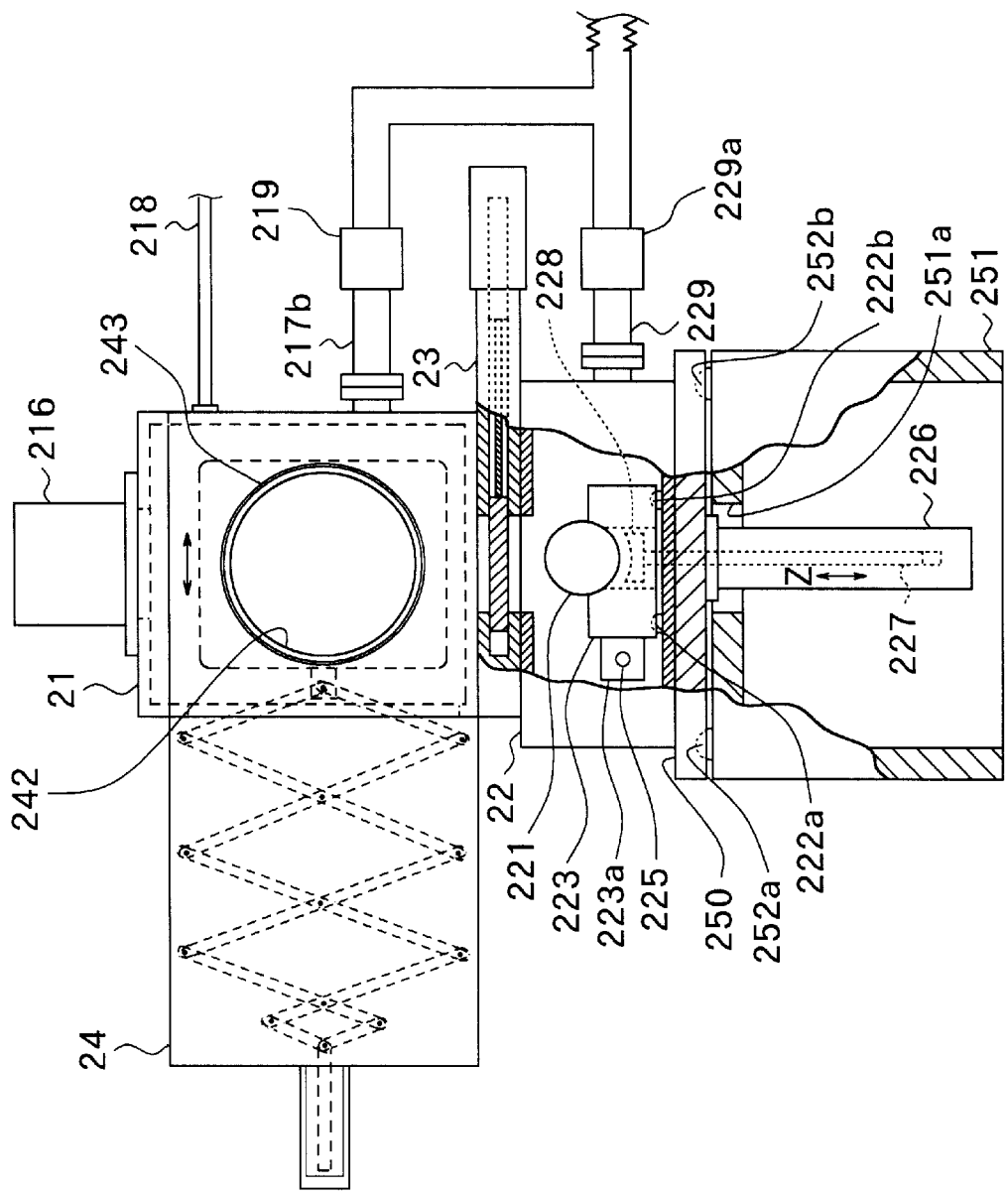
FIG. 4 is a partial cutaway front view showing the structure of a substrate side mechanism part in FIG. 1.
Figure 5:
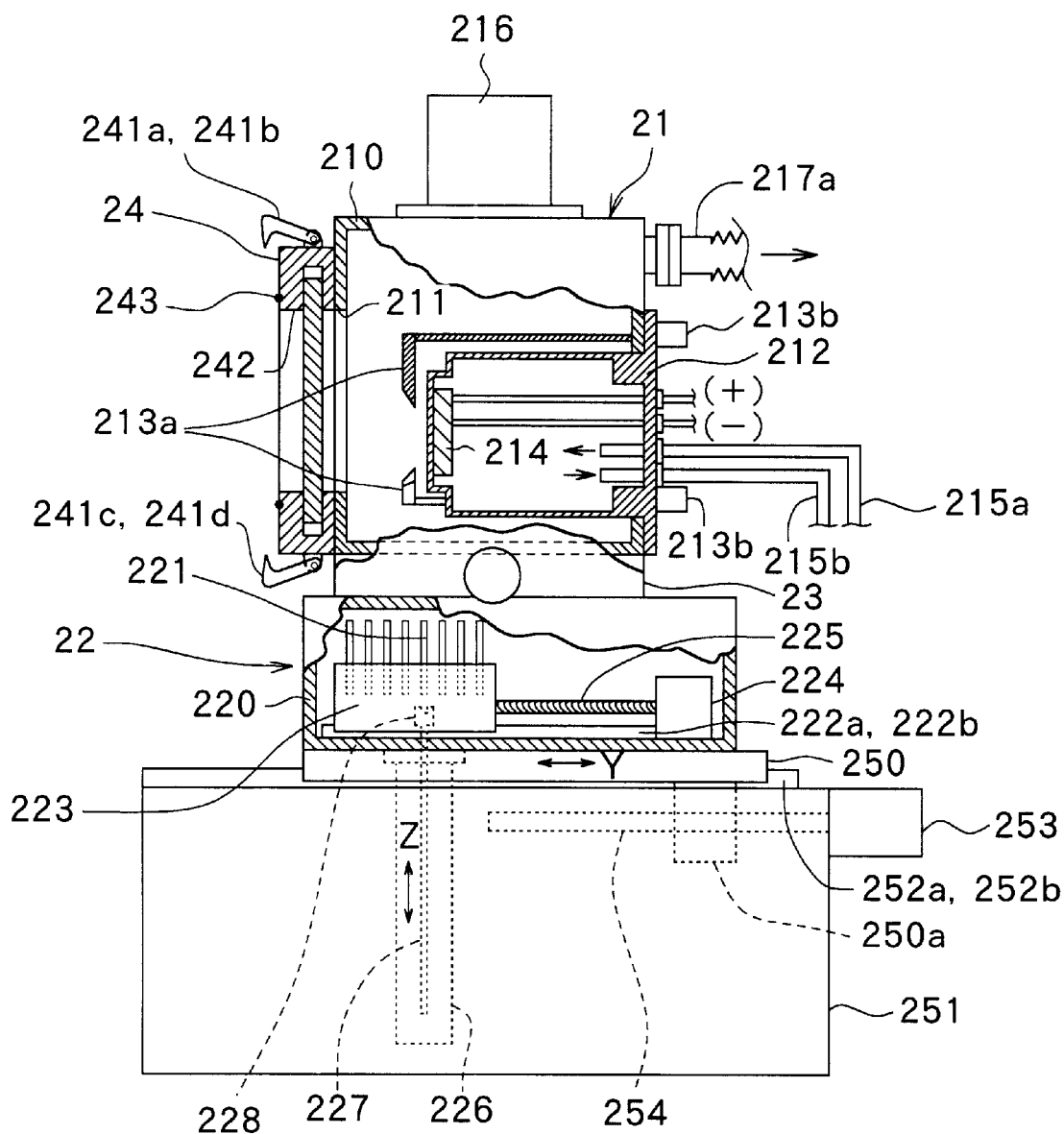
FIG. 5 is a partial cutaway side view showing the structure of the substrate side mechanism part in FIG. 1.

FIGS. 1 to 5 show the construction of a vacuum film forming/processing apparatus according to an embodiment of the invention. FIG. 1 illustrates the outside construction when the whole vacuum film forming/processing apparatus is overlooked. FIG. 2 shows the construction when a target side mechanism part 1 in FIG. 1 is seen from the front side (direction of an arrow A1 in FIG. 1). FIG. 3 is a partial cutaway view of the construction when the target side mechanism part 1 is seen from a side (direction of an arrow B1 in FIG. 1). FIG. 4 is a partial cutaway view of a substrate side mechanism part 2 in FIG. 1 seen from the front (direction of an arrow A2 in FIG. 1). FIG. 5 is a partial cutaway view of the construction of the substrate side mechanism part 2 seen from a side (direction of an arrow B2 in FIG. 1).

Since a vacuum film forming/processing method according to the embodiment is embodied by the vacuum film forming/processing apparatus according to the embodiment, the method will be described together hereinafter.

Referring to FIG. 1, the whole construction of the vacuum film forming/processing apparatus will be described. In the embodiment, as an example of the vacuum film forming/processing apparatus, an apparatus capable of continuously performing sputtering and etching in a DC electric field applying method will be described. The invention can be applied not only to the DC electric field applying method but also to a high frequency electric field applying method and to other methods.

As shown in FIG. 1, the vacuum film forming/processing apparatus comprises a target side mechanism part 1 and a substrate side mechanism part 2. The target side mechanism part 1 has three target chambers 11a to 11c each for housing a sputtering target, an etching chamber 12, and a movement mechanism part 13. On the front sides of the target chambers 11a to 11c and the etching chamber 12, gate valves 14a to 14d, driven to close/open the target chambers 11a to 11c and the etching chamber 12 from/to the outside space, are provided, respectively. The target chambers 11a to 11c and the etching chamber 12 are fixedly provided on a moving plate 130 of the movement mechanism part 13, and the chambers and the moving plate 130 can be integrally moved linearly in the direction of X in the diagram by the movement mechanism part 13. Each of the target chambers 11a to 11c and the etching chamber 12 corresponds to an example of "a second vacuum chamber" in the invention. Especially, each of the target chambers 11a to 11c corresponds to an example of "a vacuum chamber for sputtering" as "a vacuum chamber for a film formation material" in the invention. The etching chamber 12 corresponds to an example of "a vacuum chamber for etching" in the invention. The movement mechanism part 13 corresponds to a part of an example of "moving means" in the invention.

The movement mechanism part 13 has a base plate 131 fixedly provided on a base 17, rails 132a and 132b fixedly provided on the base plate 131, and a motor 133 attached to a shoulder part 131a formed so as to be risen from the top face at one end of the base plate 131. The rails 132a and 132b are fit in rail grooves (not shown) on the under face of the moving plate 130 having the function of guiding the moving plate 130. The rotary shaft (not shown) of the motor 133 is coupled to one end of a ball screw 134 provided so as to penetrate the shoulder part 131a. The other end of the ball screw 134 is screwed in a ball screw hole of the moving plate 130. When the motor 133 rotates, the ball screw 134 rotates and the moving plate 130 carries the target chambers 11a to 11c and the etching chamber 12 and moves in the X direction being guided by the rails 132a and 132b.

The substrate side mechanism part 2 has a substrate chamber 21; a substrate housing chamber 22, which is provided below the substrate chamber 21 and can house a number of substrates; a gate valve 23 provided between the substrate chamber 21 and the substrate housing chamber 22; a gate valve 24 provided on the front side of the substrate chamber 21; and a movement mechanism part 25. The gate valve 24 is used to close/open the substrate chamber 21 from/to the external space. The substrate housing chamber 22, the gate valve 23, and the substrate chamber 21 are fixedly provided on a moving plate 250 of the movement mechanism part 25 also serving as a base, and can be integrally moved linearly by the movement mechanism part 25 in the Y direction in the diagram. The gate valve 23 is used to open/close the substrate chamber 21 to/from the substrate housing chamber 22. The substrate chamber 21 corresponds to an example of "a first vacuum chamber" in the invention and the movement mechanism part 25 corresponds to an example of another part of the "moving means" in the invention.

The movement mechanism part 25 has a supporting base 251, rails 252a and 252b fixedly provided on the supporting base 251, and a motor 253 attached to a side face at one end of the supporting base 251. The rails 252a and 252b are fit in the rail grooves (not shown) on the under face of the moving plate 250 and have the function of guiding the moving plate 250. The rotary shaft (not shown) of the motor 253 is coupled to one end of a ball screw 254 provided so as to penetrate the side face of one end of the supporting base 251. The other end of the ball screw 254 is screwed in a ball screw hole of a projected part 250a (not shown in FIG. 1 but shown in FIG. 5) provided under the moving plate 250. When the motor 253 rotates, the ball screw 254 rotates. The moving plate 250 carries the substrate housing chamber 22, the gate valve 23, and the substrate chamber 21 and moves linearly in the Y direction in the diagram being guided by the rails 252a and 252b.

Making reference to FIGS. 2 and 3, the structure of the target side mechanism part 1 will be described in detail.

As shown in FIG. 3, the target chamber 11a comprises a chamber body 110, an opening 111 formed on the front side of the chamber body 110, and a target assembly unit 112 provided so as to project into the chamber from the rear side of the chamber body 110. A target 114 as a film forming material for sputtering is detachably attached on the front side of the target assembly unit 112. As the target 114, for example, a metal material such as tantalum Ta), titanium (Ti), permalloy (FeNi), cobalt platinum (CoPt), or platinum manganese (PtMn) is used. The target 114 serves as a cathode at the time of sputtering. Cooling pipes 113a and 113b are connected to the target assembly unit 112. The inside of the target assembly unit 112 and also the target 114 are cooled by a cooling water circulating in the cooling pipes. When necessary, a samarium cobalt (SmCo) magnet may be provided in the target assembly unit 112.

Exhaust pipes 115a to 115c are connected to the back side of the chamber body 110. The exhaust pipes 115a, 115b, and 115c are connected to a cryopump, a turbo molecular pump, and a rotary pump, respectively, (which are not shown) exclusive to the target side mechanism part 1. By selectively sequentially driving the pumps or variably combining and driving the pumps, the chamber body 110 can be maintained under high vacuum state. The cryopump is a vacuum pump of a type which forms a solid surface of an extremely low temperature by driving a refrigerator and condenses a gas on the solid surface to thereby remove gaseous molecules from the space. The cryopump can obtain extreme vacuum. The turbo molecular pump is a vacuum pump in which a fixed impeller (stator) and a rotary impeller (rotor) having angles in opposite directions are arranged alternately, for obtaining an exhaust action by using the fact that the probability of passage of the gaseous moleculars through the structure differs according to the direction of the passage. The turbo molecular pump can obtain extreme vacuum of $1.33 \times 10^{-7}$ Pa or lower. The rotary pump is a vacuum pump of a type which mechanically pushes air by rotating the rotor and can obtain atmospheric pressure to vacuum up to about 1.33 Pa.

As illustrated in FIG. 3, since the target chamber 11a includes only the target 114 and the member or mechanism related to maintain the target 114 but does not include a member or mechanism related to hold the substrate as in a conventional film forming chamber, the volume of the chamber body 110 is sufficiently smaller than that of the conventional film forming chamber. Consequently, it is possible to construct the single exhaust system (that is, a set of the cryopump, turbo molecular pump, and rotary pump) to be commonly used by all of the vacuum chambers in the target side mechanism part 1, that is, the target chambers 11a to 11c and the etching chamber 12.

As shown in FIGS. 2 and 3, the gate valve 14a has a housing 141, a valve plate 142 slidably provided in the housing 141, a cylinder 143 capable of reciprocating a spindle 143a by oil pressure, air pressure, or the like, and a pantograph 144 extendably provided between the spindle 143a and the valve plate 142. In the housing 141, an opening 145 as large as the opening 111 is formed in a position corresponding to the opening 111 in the target chamber 11a so that the housing 141 is opened from the surface to the back surface. The pantograph 144 is extendable by using a certain point in the housing 141 as a fulcrum 147 (FIG. 2). The spindle 143a is connected to a shorter arm side by using the fulcrum 147 as a border and the valve plate 142 is connected to the longer arm side. With such a structure, a large stroke of the valve plate 142 can be obtained by a slight stroke motion of the spindle 143a of the cylinder 143. The opening 145 is closed or opened by the valve plate 142.

As shown in FIG. 3, the peripheral part of the opening 145 on the front side of the gate valve 14a is risen from the other part, and coupling/positioning grooves 146a and 146b are formed on the upper and lower end faces of the risen part. When the target chamber 11a and the substrate chamber 21 are coupled to each other as will be described hereinafter, coupling/positioning nails 241a to 241d (FIG. 5) provided for the gate valve 24 on the substrate chamber 21 side are retained by the coupling/positioning grooves 146a and 146b to thereby position the target chamber 11a and the substrate chamber 21.

Each of the other target chambers 11b and 11c has a structure similar to that of the target chamber 11a and each of the other gate valves 14b to 14d has a structure similar to that of the gate valve 14a. The etching chamber 12 has a structure similar to that of the target chamber 11a except that the target 114 serves not as a cathode but as an anode.

The structure of the substrate side mechanism part 2 will now be described in detail making reference to FIGS. 4 and 5.

Figure 6:
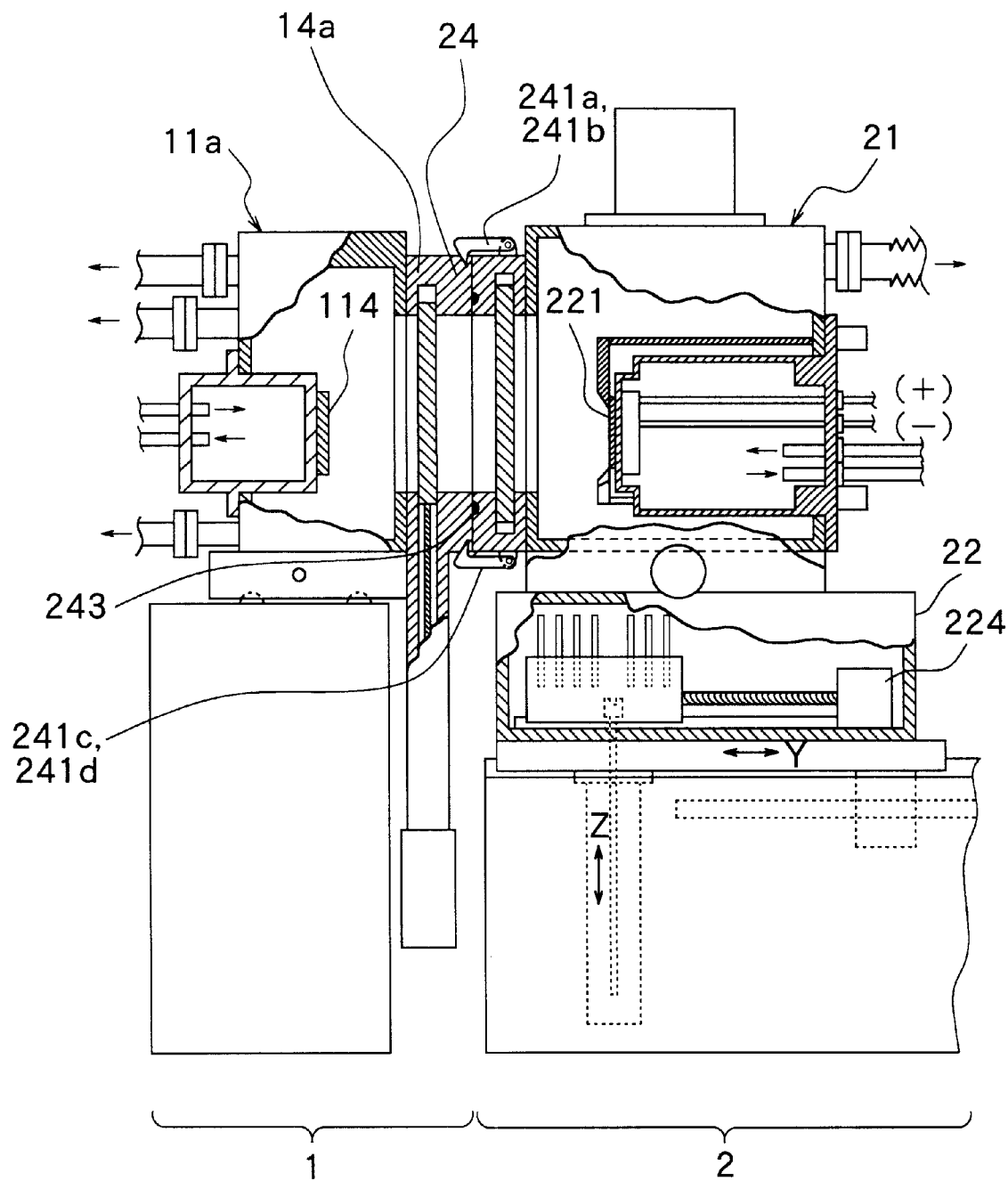
FIG. 6 is a partial cutaway side view for explaining a state which is after coupling of the target side mechanism part and the substrate side mechanism part, and is before communication of the parts.

As shown in FIG. 5, the substrate chamber 21 has a chamber body 210, an opening 211 formed on the front side of the chamber body 210, and a substrate holder assembly unit 212 provided so as to project into the chamber from the rear side of the chamber body 211. On the front side of the substrate holder assembly unit 212, an anode (not shown) is formed. As shown in FIG. 6 which will be described hereinafter, a substrate (wafer) 221 (FIG. 5) as a target onto which a film forming process is performed is conveyed from the substrate housing chamber 22 and is held by clamp nails 213a. The clamp nails 213a are driven by actuator units 213b provided outside on the rear face of the substrate holder assembly unit 212. On the rear side of the substrate attaching surface of the substrate holder assembly unit 212, a heater 214 for heating the substrate is disposed. Cooling pipes 215a and 215b are connected to the substrate holder assembly unit 212 and overheat in the substrate holder assembly unit 212 and also the substrate 221 is prevented by cooling water circulating in the cooling pipes.

On the top surface of the chamber body 210, a cryopump 216 dedicated to the substrate chamber 21 is directly attached. An exhaust pipe 217a connected to a turbo molecular pump (not shown) exclusive to the substrate chamber 21 is connected to the rear surface of the chamber body 210, and an exhaust pipe 217b is connected to one of side faces of the chamber body 210. The exhaust pipe 217b is connected via a valve 219 to a rotary pump (not shown) commonly used by the substrate chamber 21 and the substrate housing chamber 22. The cryopump 216, turbo molecule pump, and rotary pump are selectively, sequentially driven or variably combined and driven, thereby enabling the chamber body 210 to be exhausted to a high degree of vacuum. A gas feed pipe 218 for feeding a predetermined gas (for example, argon (Ar)) used for sputtering is connected to one side of the substrate chamber 21.

The substrate housing chamber 22 has a substrate stocker 223 which is provided movably on rails 222a and 222b attached on the bottom of the body 220 and holds a number of substrates 221, a motor 224 mounted on the bottom of the body 220, and a ball screw 225 whose one end is connected to the rotary shaft (not shown) of the motor 224. The other end of the ball screw 225 is screwed in a ball screw hole of a projection 223a (FIG. 4) formed on a side face of the substrate stocker 223. When the motor 224 is rotated, the ball screw 225 rotates, so that the whole substrate stocker 223 moves linearly in the Y direction shown in FIG. 5 being guided by the rails 222a and 222b.

On the under surface of the body 220 of the substrate housing chamber 22, a cylinder 226, which can reciprocate a spindle 227 in the vertical direction (Z direction in the diagram) by oil pressure or air pressure, is attached. The upper end of the spindle 227 penetrates the bottom face of the body 220 extending to the inside of the body 220. A grasping part 228 having a groove to grasp the substrate 221 is attached to the upper end of the spindle 227. The cylinder 226 is prevented from interference with the supporting base 251 by an opening 251a formed along the Y direction in the center part of the supporting base 251.

As shown in FIG. 4, the center part of the substrate stocker 223 is completely notched in the vertical direction.

A number of grooves (not shown) are formed in the Y direction at predetermined intervals on both sides of the notch, and the substrates 221 are inserted in each of the grooves. When the cylinder 226 is driven, the grasping part 228 rises in the notch of the substrate stocker 223, and can hold one of the substrates 221 stocked in the substrate stocker 223. The grasping part 228 grasping the substrate 221 further moves into the substrate chamber 21 in a state where the gate valve 23 is open, and can convey the substrate 221 to the position of the substrate holder assembly unit 212.

An exhaust pipe 229 is connected to one of the side faces of the substrate housing chamber 22. The exhaust pipe 229 is connected via a valve 229a to the rotary pump (not shown) which is commonly used by the substrate chamber 21 and the substrate housing chamber 22. By opening the valve 229a, the substrate housing chamber 22 is exhausted to a predetermined degree of vacuum.

The coupling/positioning nails 241a to 241d, which come into engagement with the coupling/positioning grooves 146a and 146b on the target chamber 11a side when the substrate chamber 21 and the target chamber 11a are coupled to each other, are provided at the upper and lower ends of the gate valve 24. A circular groove is formed around an opening 242 on the front face side of the gate valve 24 and an O ring 243 is fit in the circular groove. The O ring 243 can prevent the outside air from being leaked into the chambers when the substrate chamber 21 and the target chamber 11a are communicated with each other. Since the other structure of the gate valve 24 is similar to that of the gate valve 14a of the target side mechanism part 1 and the like, its description is omitted here. The structure of the gate valve 23 is similar to that of the gate valve 14a or the like, so its description is also omitted.

Referring to FIGS. 6 to 8A and 8B, the operation of the vacuum film forming/processing apparatus having such a construction will now be described.

A series of operations, when a substrate housed in the substrate housing chamber 22 is conveyed and set in the substrate chamber 21 and a film forming process is performed onto the substrate by using a target held in the target chamber 11a as a film forming material, will be described as an example. Assuming now that the substrate 221 is already housed in the substrate housing chamber 22 in the substrate side mechanism part 2, and each of the substrate chamber 21 and the substrate housing chamber 22 is maintained at a predetermined degree of vacuum (for example, about 5.32 Pa). It is also assumed that the target chamber 11a in the target side mechanism part 1 is maintained at a predetermined high vacuum (about $1.33 \times 10^{-3}$ Pa).

By rotating the motor 224 in the substrate housing chamber 22 to move the substrate stocker 223, the substrate 221 to be processed is positioned in a conveyance start position (that is, the position just above the grasping part 228).

The exhaust system is then controlled so that the degree of vacuum in the substrate housing chamber 22 and that in the substrate chamber 21 coincide with each other. When the degrees of vacuum in the two chambers coincide with each other, the gate valve 23 is opened and the cylinder 226 is driven. By the operation, the grasping part 228 rises, moves into the substrate chamber 21 while grasping the substrate 221, and conveys the substrate 221 to a predetermined position in the substrate holder assembly unit 212. The substrate 221 is fixed to the substrate holder assembly unit 212 by the clamp nails 213a. Subsequently, the cylinder 226 is driven to return the grasping part 228 to the original position and the gate valve 23 is closed.

On the other hand, in the target side mechanism part 1, by rotating the motor 133 in the movement mechanism part 13, all of the target chambers 11a to 11c and the etching chamber 12 are moved in the X direction and the target chamber 11a is positioned in a predetermined position.

In the substrate side mechanism part 2, by rotating the motor 253 in the movement mechanism part 25, a unit comprising the substrate chamber 21 and the substrate housing chamber 22 and so on is moved toward the target side mechanism part 1 and the substrate chamber 21 is moved to the position in which the substrate chamber 21 can be coupled to the target chamber 11a. In the position, the coupling/positioning nails 241a to 241d provided for the gate valve 24 in the substrate side mechanism part 2 are driven so as to come into engagement with the coupling/positioning grooves 146a and 146b formed in the gate valve 14a in the target side mechanism part 1, thereby completing the relative positioning of the chambers. The coupling/positioning nails 241a to 241d can be driven by an actuator such as a motor (not shown).

FIG. 6 illustrate a state where the positioning of the substrate chamber 21 with respect to the target chamber is completed. The diagram shows the state seen from the arrows B1 and B2 in FIG. 1. As shown in FIG. 6, the surface of the gate valve 14a in the target side mechanism part 1 is in contact with the surface of the gate valve 24 in the substrate side mechanism part 2 via the O ring 243. The coupling/positioning nails 241a, 241b and 241c, 241d are in engagement with the coupling/positioning grooves 146a and 146b of the target side mechanism part 1, respectively.

Figure 7:
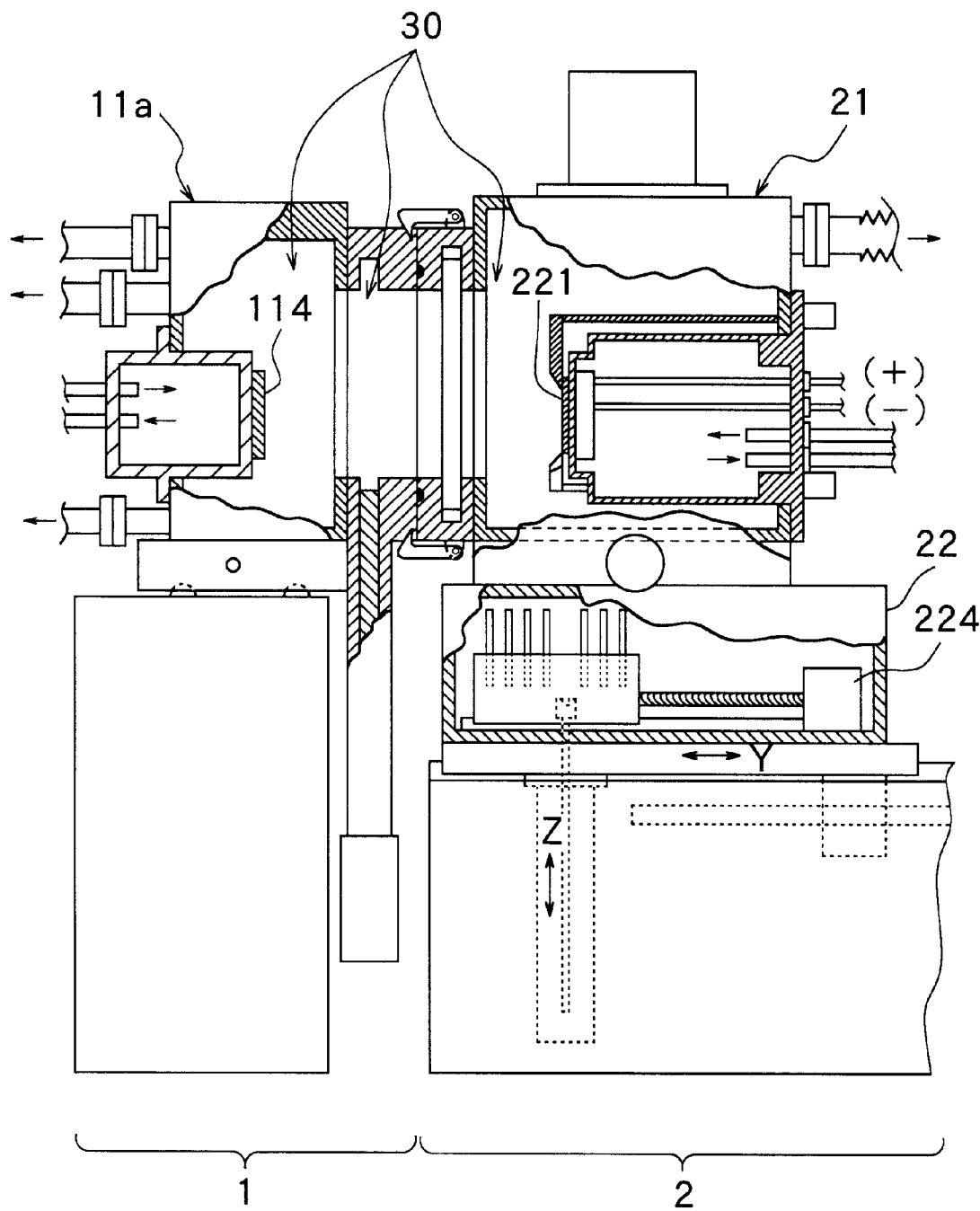
FIG. 7 is a partial cutaway side view for explaining a state after the target side mechanism part and the substrate side mechanism part are communicated with each other.

A predetermined gas (for example, argon) is then introduced into the target chamber 11a so as to make the degree of vacuum coincide with the degree of vacuum of the substrate chamber 21. The gate valve 24 in the substrate side mechanism part 2 is opened first. A small amount of air existing between the gate valves 14a and 24 is consequently moved to the substrate chamber 21 side and exhausted. Then the gate valve 14a is opened, so that, as shown in FIG. 7, the target chamber 11a and the substrate chamber 21 communicate with each other, thereby forming a film forming chamber 30. In a manner similar to FIG. 6, FIG. 7 shows the state seen from the directions of the arrows B1 and B2 in FIG. 1.

Since the inside of the film forming chamber 30 is under negative pressure with respect to the outside air, the target chamber 11a and the substrate chamber 21 attract each other strongly and the O ring 243 exists on the contact surfaces of the gate valves 14a and 24. Consequently, the air tightness in the film forming chamber 30 is sufficiently kept.

An argon gas is introduced through the gas feed pipe 218 (FIG. 4) of the substrate chamber 21 to set the degree of vacuum in the film forming chamber 30 to, for example, about 1.33 to 2.66 Pa. After that, sputtering is performed by applying a DC electric field between the target 114 and the substrate 221. To be specific, glow discharge occurs in the argon gas atmosphere, positive ions in the plasma collide with the surface of the target 114 to move target atoms out. The moved target atoms are attracted by the electric field and deposited on the surface of the substrate 221 on the anode, thereby forming a thin film on it.

When the sputtering is finished, the gate valves 14a and 24 are closed. Air is then introduced via a leak valve (not shown) into the space sandwiched by the two gate valves to thereby change the space under the atmospheric pressure. The operation facilitates separation of the target chambers 11a to 11c from the substrate chamber 21 which will be performed in the following step. The coupling/positioning nails 241a to 241d are released from the coupling positioning grooves 146a and 146b.

The motor 253 in the substrate side mechanism part 2 is rotated to move the unit comprising the substrate chamber 21 and the substrate housing chamber 22 so as to be apart from the target side mechanism part 1 and to return to the original position.

On the other hand, in the target side mechanism part 1, all of the target chambers 11a to 11c and the etching chamber 12 are moved by the movement mechanism part 13, and the target chamber (for example, the target chamber 11b) to be used in the following film forming step is moved to a predetermined position.

When the movement of the target chamber in the target side mechanism part 1 is completed, the substrate side mechanism part 2 moves the substrate chamber 21 and the like again toward the target side mechanism part 1, coupling and communicating operations similar to the above are performed, and then the sputtering process is carried out.

Similarly, the target chambers 11a to 11c and the etching chamber 12 and the substrate chamber 21 are coupled and communicated while changing their relative positions to thereby form a film forming chamber, and to perform the sputtering or etching. The thin film formed on the substrate 221 is etched or the substrate which is not yet subjected to the film forming process is cleaned in the film forming chamber which is formed by coupling and communicating the etching chamber 12 and the substrate chamber 21. In this case, the target 114 in the etching chamber 12 serves as an anode and functions as an etching electrode.

When all of the film forming processes to the substrate 221 are finished, the substrate side mechanism part 2 returns the unit comprising the substrate chamber 21 and the substrate housing chamber 22 to the original predetermined position, makes the degree of vacuum in the substrate chamber 21 and that in the substrate housing chamber 22 coincide with each other, and opens the gate valve 23. After that, the cylinder 226 is driven to move the grasping part 228 and the substrate 221 is returned to the original position in the substrate stocker 223, in the substrate housing chamber 22. Further, when there is an unprocessed substrate, the substrate stocker 223 is moved by a predetermined amount, and the next substrate is positioned to the conveyance start position. The subsequent operations are similar to those described above.

Figures 8A, 8B:
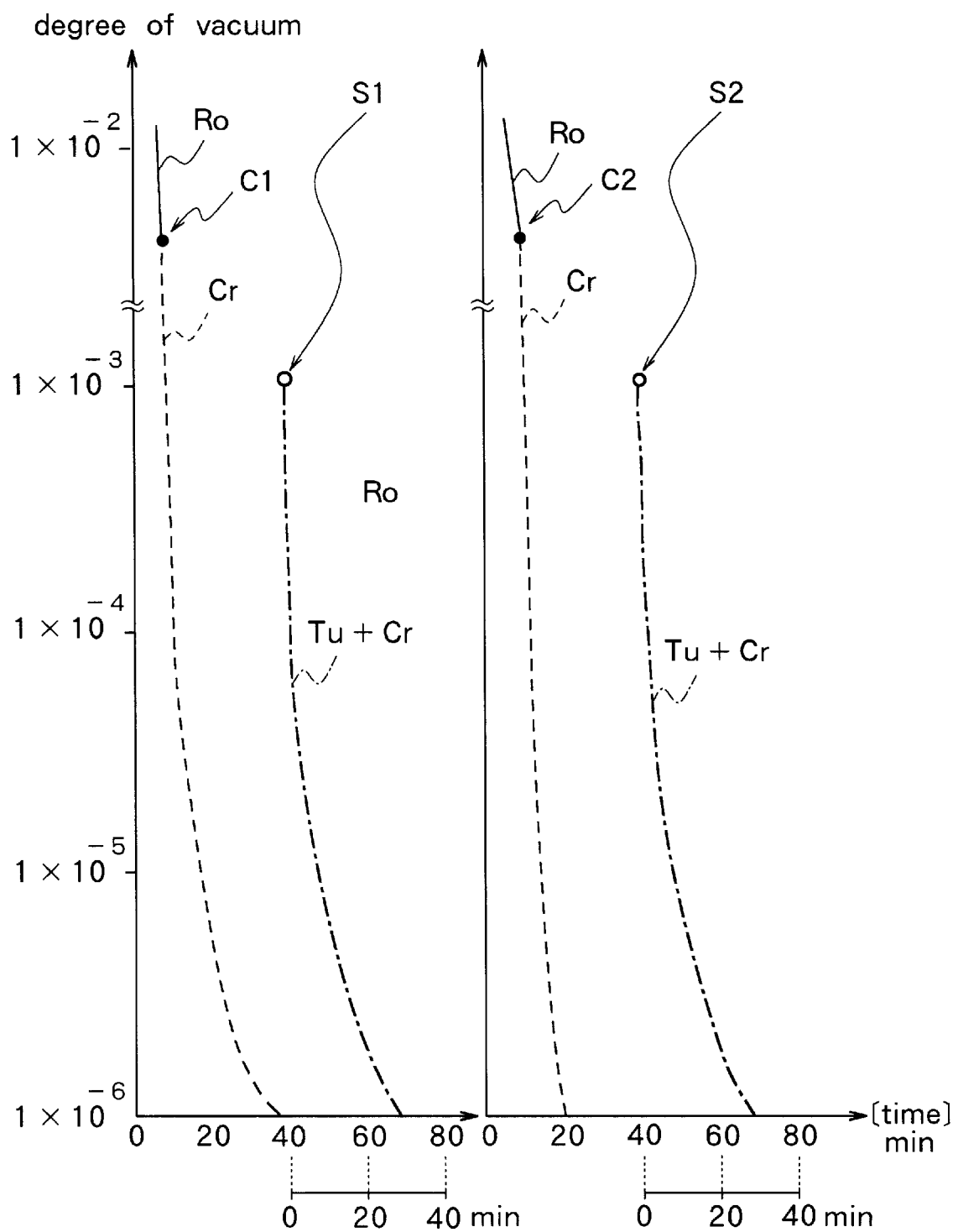
FIGS. 8A and 8B are diagrams showing an example of change in degree of vacuum in each of a target chamber and a substrate chamber.

FIGS. 8A and 8B show an example of the state of change in degree of vacuum of each of the target chamber 11a and the substrate chamber 21 in a period from the start of exhaust to the sputtering. FIG. 8A indicates a change in degree of vacuum of the target chamber 11a and FIG. 8B shows a change in degree of vacuum of the substrate chamber 21. In each of the graphs, the horizontal axis denotes exhaust time and the vertical axis indicates the degree of vacuum. Reference characters Ro shows a curve of exhaust by the rotary pump, Cr indicates a curve of exhaust by the cryopump, and Tu+Cr indicates a curve of exhaust when both of the turbo molecular pump and the cryopump are used.

As shown in the graphs, with respect to the target chamber 11a, first, the air is exhausted to a point C1 (about $9.31 \times 10^{-1}$ Pa) by the rotary pump and then exhausted to about $1.33 \times 10^{-4}$ Pa by the cryopump. The operation takes about 40 minutes. As for the substrate chamber 21, first, the air is exhausted to a point C2 (about $9.31 \times 10^{-1}$ Pa) by the rotary pump and then exhausted to a high degree of vacuum of $1.33 \times 10^{-4}$ Pa or higher by the cryopump. The operation takes about 20 minutes. At time points S1 and S2 after the elapse of about 40 minutes, the target chamber 11a and the substrate chamber 21 are connected to each other and, further, argon gas is introduced to set the degree of vacuum to about $1.33 \times 10^{-1}$ Pa. In such a state, the sputtering is started. After the sputtering is started, the air is exhausted by using the turbo molecular pump in addition to the cryopump.

As mentioned above, in the vacuum film forming/processing apparatus according to the embodiment, the substrate chamber 21 for housing and holding substrates and the target chambers 11a to 11c each for housing and holding a target and the etching chamber 12 are moved relatively. One of the target chambers 11a to 11c and the etching chamber 12 is selectively coupled and communicated with the substrate chamber 21 to thereby form the film forming chamber 30, and the film forming process is performed to the substrate in the film forming chamber 30 to form a multilayer film. Consequently, a conveying chamber which is provided conventionally is unnecessary. A problem of dusts and contamination which occurs when the substrate passes through the conveying chamber as in a conventional manner is eliminated, so that the film quality and stability are improved.

Since the target chamber houses only the target and members used for holding the target, the volume of it can be extremely small. For example, also in the case where the target chamber is opened to the atmosphere for such as replacement or maintenance of the target, the target chamber can be returned to the original extreme vacuum state in an extremely short time, so that the productivity is high. Since the exhaust capability of the pump necessary for the exhaust is lower than that of the conventional one, the invention is advantageous also from the viewpoint of the cost of the equipment.

Since not the conventional method of moving the substrate itself among film forming chambers, but the method of fixing a substrate in the substrate chamber and changing the relative positional relation between the substrate chamber and the target chamber is employed, the degree of freedom in combination of the target chambers and the substrate chamber is high and various layouts as mentioned hereinafter are possible.

Specifically, in the embodiment, the target chambers 11a to 11c and the etching chamber 12 in the target side mechanism part 1 are arranged linearly in the horizontal direction and the substrate chamber 21 is disposed in the plane including the arrangement direction (horizontal plane). Other various modifications as shown in, for example, FIGS. 9 to 13 can be also considered. The various modifications will now be described hereinafter. In the diagrams, only the target chambers and the substrate chamber are shown for simplicity and the other mechanism part is omitted. In the diagrams, a target chamber T represents the target chambers 11a to 11c and the etching chamber 12 in the foregoing embodiment, and a substrate chamber S corresponds to the substrate chamber 21 in the embodiment. A gate valve Gt corresponds to the gate valve 14a or the like in the embodiment and a gate valve Gs corresponds to the gate valve 24 in the embodiment.

Figure 9:
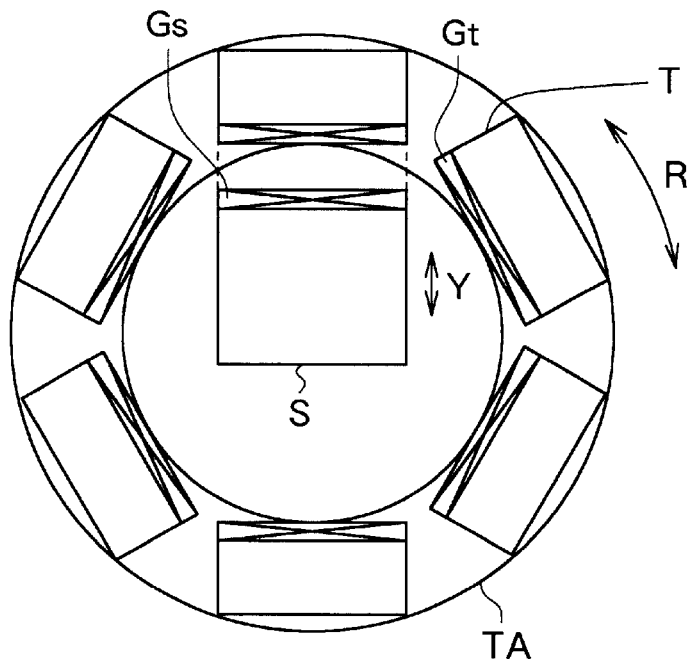
FIG. 9 is a plan view showing a modification of the vacuum film forming/processing apparatus according to the embodiment of the invention.
Figure 10:
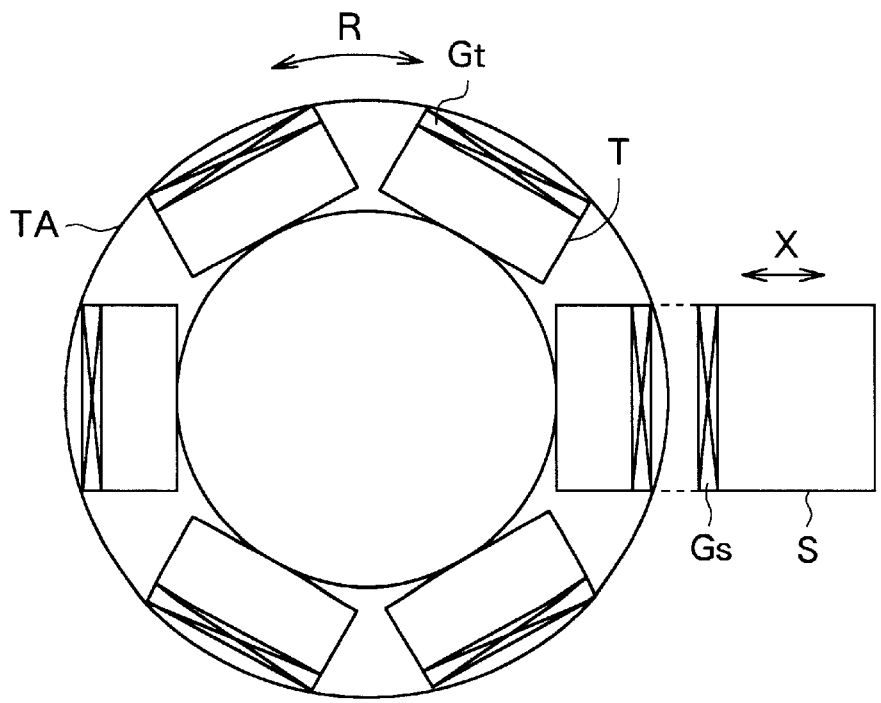
FIG. 10 is a plan view showing another modification of the vacuum film forming/processing apparatus according to the embodiment of the invention.

FIG. 9 is a plan view of a modification in which a plurality of target chambers T are arranged concentrically with a turn table TA on the turn table TA which is disposed in the horizontal plane and the substrate chamber S is disposed on the inside of the turn table TA. In the modification, the target chamber T is rotatably movable in the circumferential direction R in association with the movement of the turn table TA, and the substrate chamber S is linearly movable in the radial direction Y of the turn table TA. The opening faces (communication faces) which are opened or closed by gate valves Gt and Gs are arranged so as to face in the horizontal direction in a manner similar to the embodiment. According to the modification, even when a number of target chambers T are necessary, not so large arrangement space is required and a compact layout is possible. For example, as shown in FIG. 10, the substrate chamber S may be disposed on the outside of the turn table TA and may be linearly moved in the radial direction X of the turn table TA.

Figure 11:
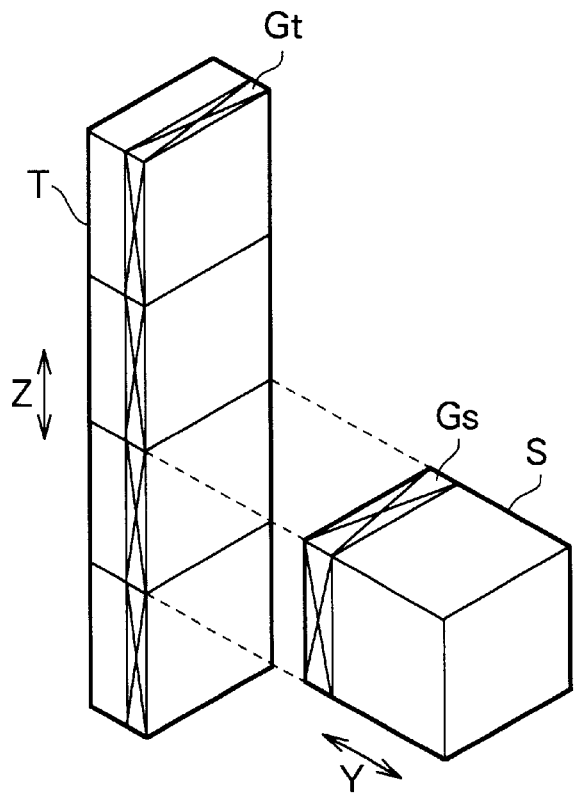
FIG. 11 is a plan view showing still another modification of the vacuum film forming/processing apparatus according to the embodiment of the invention.

FIG. 11 shows three-dimensional view of another modification in which a plurality of target chambers T are arranged in the vertical direction and the substrate chamber S is disposed so as to be included in the plane including the vertical direction. In the modification, the target chambers T are movable in the vertical direction and the substrate chamber S is linearly movable in the horizontal direction Y. The opening faces of the chambers opened or closed by the gate valves Gt and Gs are arranged so as to face in the horizontal direction in a manner similar to the above-mentioned modification (FIG. 9). According to the modification of FIG. 11, even when a number of target chambers T are necessary, the arrangement space in plan view can be reduced more as compared with the foregoing modification.

Figure 12:
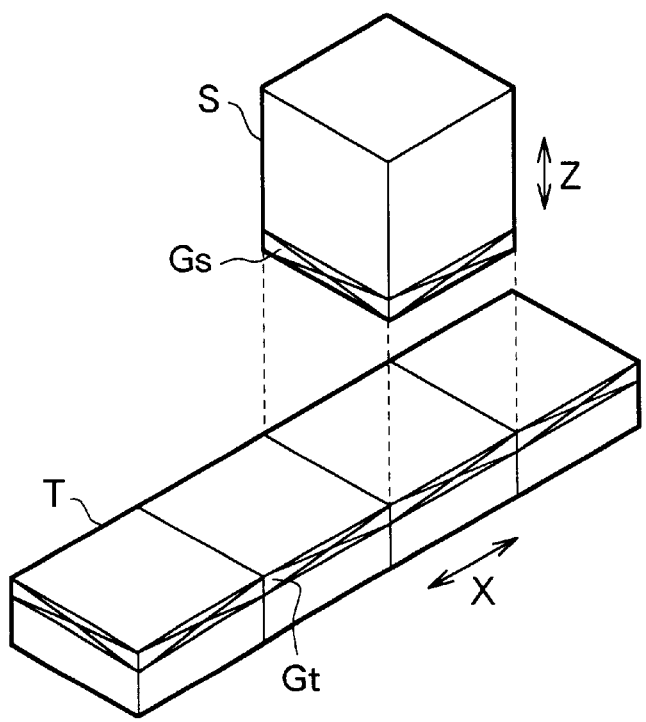
FIG. 12 is a plan view showing still another modification of the vacuum film forming/processing apparatus according to the embodiment of the invention.

FIG. 12 shows three-dimensional view of still another modification in which a plurality of target chambers T are arranged in the horizontal plane and the substrate chamber S is disposed above the target chamber T. In the modification, the target chambers T are linearly movable in the horizontal direction X and the substrate chamber S is movable in the vertical direction Z. In the modification, all of the opening faces of the target chambers T opened or closed by the gate valves Gt face upward, and the opening face of the substrate chamber S opened or closed by the gate valve Gs faces downward.

Figure 13:
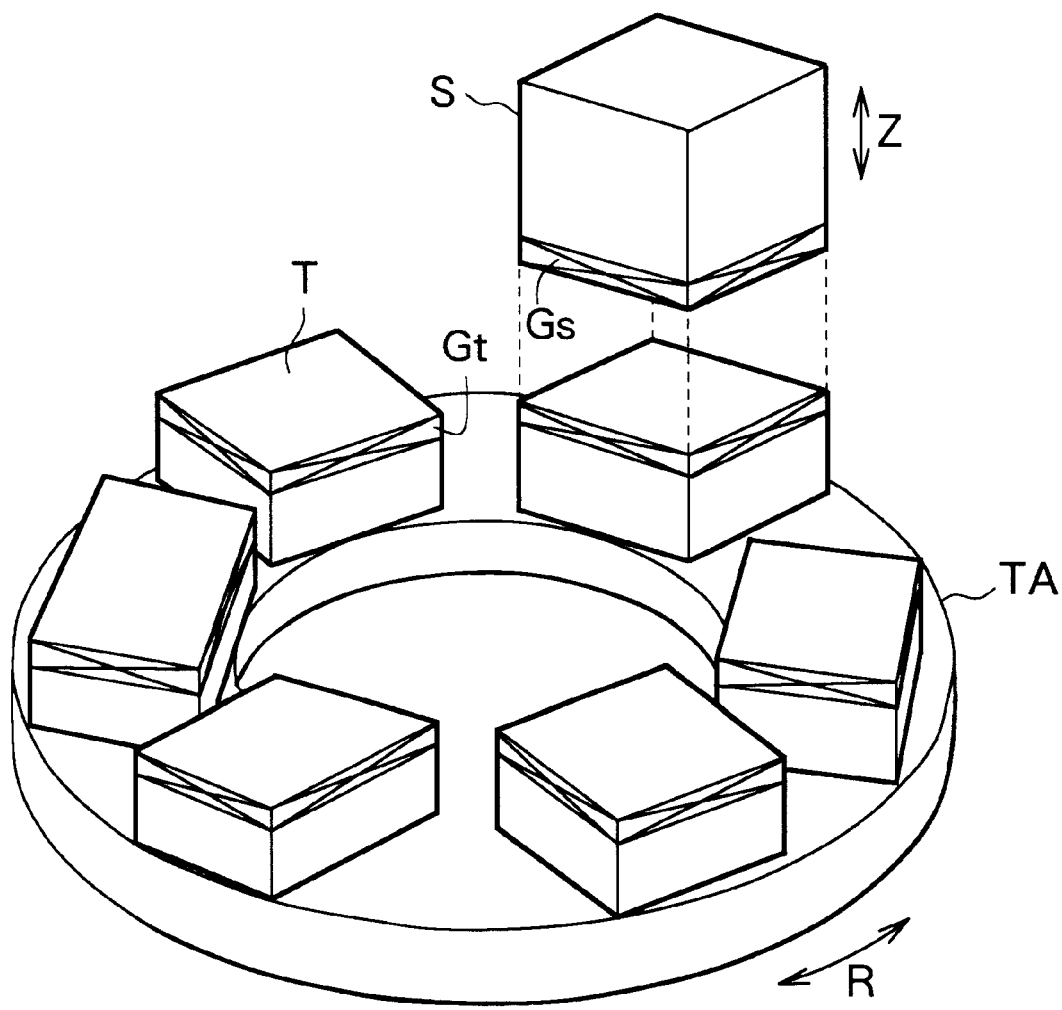
FIG. 13 is a plan view showing still another modification of the vacuum film forming/processing apparatus according to the embodiment of the invention.

FIG. 13 shows three-dimensional view of still another modification in which a plurality of target chambers T are arranged concentrically with the turn table TA on the turn table TA disposed in the horizontal plane, and the substrate chamber S is disposed above the target chambers T. The target chambers T are rotatably movable in the circumferential direction R in association with the movement of the turn table TA, and the substrate chamber S is movable in the vertical direction Z. The fact that all of the opening faces of the target chambers T opened or closed by the gate valves Gt face upward and the opening face of the substrate chamber S opened or closed by the gate valve Gs faces downward is similar to the case of the modification in FIG. 12.

Although the invention has been described by the embodiments, the invention is not limited to the embodiments but can be variously modified. For example, although the target chambers T are moved in the arrangement direction (X direction) and the substrate chamber S is moved in the direction (Y direction) which perpendicularly crosses the movement direction of the target chambers T in the foregoing embodiment and modifications, the invention is not limited to the arrangement. As long as the target chambers T and the substrate chamber S move relatively, they can be moved in other manners. For example, a construction such that the target chambers T are moved in the Y direction and the substrate chamber S is moved in the X direction is also possible. It is also possible to fix the target chambers T and move only the substrate chamber S in the X and Y directions. On the contrary, it is also possible to fix the substrate chamber S and move only the target chambers T in the X and Y directions.

Although the substrate chamber S is disposed above the target chambers T, in the modifications shown in FIGS. 12 and 13, contrarily, the substrate chamber S may be disposed below the target chambers T.

Although the case where the vacuum film forming/Processing apparatus has three target chambers and one etching chamber has been described in the foregoing embodiment, the apparatus may comprise target chambers and etching chambers of the number different from the above.

Although it is described in the foregoing embodiment that the thin film forming process is performed by sputtering, the invention is not limited to this. As long as the method requires a sample for film formation or electrode which is used with a substrate as a set, the invention may be applied to the other film forming methods. For example, the invention may be applied to thin film formation by vacuum evaporation. In case of the vacuum evaporation, however, it is necessary to dispose the substrate chamber S above the target chamber T as shown in FIGS. 12 or 13, due to the principle of the vacuum evaporation.

As described above, according to the vacuum film forming/processing apparatus or method of the invention, a relative moving operation is performed between the first vacuum chamber for housing and holding a substrate and the plurality of second vacuum chambers including a vacuum chamber for housing and holding a film formation material, any one of the second vacuum chambers and the first vacuum chamber are selectively coupled to each other and the spaces of the chambers are communicated with each other. In such a state, the film process to the substrate in the first vacuum chamber is performed. Consequently, a conveying apparatus for a substrate and a conveying chamber for housing the conveying apparatus which are conventionally necessary becomes unnecessary. A problem of dusts or contamination conventionally occurring when a substrate passes through the conveying chamber is therefore eliminated, and the quality and the stability of the film are increased, and the yield of products can be improved.

According to the invention, since the vacuum chamber for a film formation material in the second vacuum chambers houses only the film formation material and members used to hold the material, an extremely small volume of the chamber is sufficient. Consequently, in case of opening the vacuum chamber for a film formation material to the atmosphere for such as replacement, maintenance of the material, the vacuum chamber can be returned to the original high vacuum state in an extremely short time and the productivity can be increased. Further, since the exhausting capability of a pump is lower than the conventional one, the invention is advantageous also from the viewpoint of costs of equipment.

According to the invention, unlike the conventional method, a substrate is fixed in the first vacuum chamber and the relative positional relation between the first and second vacuum chambers is changed. Consequently, the degree of freedom in combining the vacuum chambers is high and various layouts can be used in accordance with circumstances.

Obviously many modifications and variations of the present invention are possible in the light of the above teachings. It is therefore to be understood that within the scope of the appended claims the invention may be practiced otherwise than as specifically described.

What is claimed is:

1. A vacuum film forming/processing apparatus comprising:

a first vacuum chamber for housing a substrate as a target to which a film process is performed;

a plurality of second vacuum chamber including at least one vacuum chamber for housing a film process material; and moving means for moving the first and second vacuum chambers relatively, wherein the plurality of second vacuum chambers are arranged in a predetermined direction, and;

the moving means has a mechanism for moving all of the plurality of second vacuum chambers together in a predetermined direction, and wherein any one of the second vacuum chambers and the first vacuum chamber are selectively coupled to each other to communicate the spaces in the chambers with each other, and a film process is performed to the substrate in the first vacuum chamber.

2. The vacuum film forming/processing apparatus according to claim 1, wherein the predetermined direction is along a straight line extending in a horizontal direction.

3. The vacuum film forming/processing apparatus according to claim 2, wherein the first vacuum chamber is disposed on a horizontal plane including the arranged second vacuum chambers.

4. The vacuum film forming/processing apparatus according to claim 3, wherein the moving means has a mechanism of moving the first vacuum chamber in a horizontal direction toward the second vacuum chamber.

5. The vacuum film forming/processing apparatus according to claim 2, wherein the first vacuum chamber is disposed either above or below the second vacuum chamber.

6. The vacuum film forming/processing apparatus according to claim 5, wherein the moving means has a mechanism of moving the first vacuum chamber in the vertical direction toward the second vacuum chamber.

7. The vacuum film forming/processing apparatus according to claim 1, wherein the predetermined direction is along a circle extending in a horizontal direction.

8. The vacuum film forming/processing apparatus according to claim 7, wherein the first vacuum chamber is disposed on a horizontal plane including the arranged second vacuum chambers.

9. The vacuum film forming/processing apparatus according to claim 8, wherein the moving means has a mechanism of moving the first vacuum chamber in a horizontal direction toward the second vacuum chamber.

10. The vacuum film forming/processing apparatus according to claim 7, wherein the first vacuum chamber is disposed either above or below the second vacuum chamber.

11. The vacuum film forming/processing apparatus according to claim 10, wherein the moving means has a mechanism of moving the first vacuum chamber in a vertical direction toward the second vacuum chamber.

12. The vacuum film forming/processing apparatus according to claim 1, wherein the predetermined direction is along a straight line extending in a vertical direction.

13. The vacuum film forming/processing apparatus according to claim 12, wherein the first vacuum chamber is disposed on a vertical plane including the arranged second vacuum chambers.

14. The vacuum film forming/processing apparatus according to claim 13, wherein the moving means has a mechanism of moving the first vacuum chamber in the horizontal direction toward the second vacuum chamber.

15. A vacuum film forming/processing apparatus as claimed in claim 1, wherein:

the first vacuum chamber is usable to hold the substrate as the target; and the at least one of plurality of second vacuum chambers is usable to hold the film process material.

16. A vacuum film forming/processing method comprising the steps of:

housing a substrate as a target to which a film process is performed in a first vacuum chamber;

housing a film process material in at least one of vacuum chambers included in a plurality of second vacuum chambers;

relatively moving a first vacuum chamber and the plurality of second vacuum chambers, thereby selectively coupling any one of the plurality of second vacuum chambers to the first vacuum chamber and communicating the spaces in the chambers with each other; and performing a film process to the substrate in the first vacuum chamber, wherein the plurality of second vacuum chambers are arranged in a predetermined direction; and all of the plurality of second vacuum chambers are moved together in the predetermined direction.

17. The vacuum film forming/processing method according to claim 16, wherein the predetermined direction is along a straight line extending in a horizontal direction.

18. The vacuum film forming/processing method according to claim 17, wherein the first vacuum chamber is disposed on a horizontal plane including the plurality of arranged second vacuum chambers.

19. The vacuum film forming/processing method according to claim 18, wherein the first vacuum chamber is moved in a horizontal direction toward the plurality of second vacuum chambers.

20. The vacuum film forming/processing method according to claim 17, wherein the first vacuum chamber is disposed either above or below the plurality of second vacuum chambers.

21. The vacuum film forming/processing method according to claim 20, wherein the first vacuum chamber is moved in a vertical direction toward the plurality of second vacuum chambers.

22. The vacuum film forming/processing method according to claim 16, wherein the predetermined direction is along a circle extending in a horizontal direction.

23. The vacuum film forming/processing method according to claim 22, wherein the first vacuum chamber is disposed on a horizontal plane including the plurality of arranged second vacuum chambers.

24. The vacuum film forming/processing method according to claim 23, wherein the first vacuum chamber is moved in a horizontal direction toward the plurality of second vacuum chambers.

25. The vacuum film forming/processing method according to claim 22, wherein the first vacuum chamber is disposed either above or below the plurality of second vacuum chambers.

26. The vacuum film forming/processing method according to claim 25, wherein the first vacuum chamber is moved in a vertical direction toward the plurality of second vacuum chambers.

27. The vacuum film forming/processing method according to claim 16, wherein the predetermined direction is along a straight line extending in a vertical direction.

28. The vacuum film forming/processing method according to claim 27, wherein the first vacuum chamber is disposed on a vertical plane including the plurality of arranged second vacuum chambers.

29. The vacuum film forming/processing method according to claim 28, wherein the first vacuum chamber is moved in a horizontal direction toward the plurality of second vacuum chambers.

30. A vacuum film forming/processing method as claimed in claim 16, wherein:

housing the substrate as the target to which a film process is performed in the fist vacuum chamber comprises holding the substrate in the first vacuum chamber; and housing the film process material in the at least one of the plurality of second vacuum chambers comprises holding the film process material in the at least one of the plurality of second vacuum chambers.

* * * * *